United States Patent
Funato et al.

(10) Patent No.: US 8,085,548 B2
(45) Date of Patent: Dec. 27, 2011

(54) CIRCUIT FOR SUPPRESSING ELECTROMAGNETIC INTERFERENCE, IMPLEMENTATION STRUCTURE AND ELECTRONIC APPARATUS IMPLEMENTING THE SAME

(75) Inventors: Hiroki Funato, Novi, MI (US); Takashi Suga, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 1092 days.

(21) Appl. No.: 11/847,418

(22) Filed: Aug. 30, 2007

(65) Prior Publication Data
US 2008/0074857 A1  Mar. 27, 2008

(30) Foreign Application Priority Data
Sep. 1, 2006 (JP) .................. 2006-237160

(51) Int. Cl.
*H05K 1/18* (2006.01)
(52) U.S. Cl. ......... 361/763; 361/761; 361/764; 361/795
(58) Field of Classification Search .......... 361/763–766; 174/261–264
See application file for complete search history.

(56) References Cited

U.S. PATENT DOCUMENTS

| | | | | |
|---|---|---|---|---|
| 5,926,377 A | * | 7/1999 | Nakao et al. ................... | 361/763 |
| 6,104,258 A | * | 8/2000 | Novak ......................... | 333/22 R |
| 6,198,362 B1 | | 3/2001 | Harada et al. | |
| 6,353,540 B1 | * | 3/2002 | Akiba et al. .................. | 361/794 |
| 6,359,237 B1 | | 3/2002 | Tohya et al. | |

FOREIGN PATENT DOCUMENTS

| | | |
|---|---|---|
| JP | 07-225634 | 8/1995 |
| JP | 09-129319 | 5/1997 |
| JP | 10-190166 | 7/1998 |
| JP | 10-242601 | 9/1998 |
| JP | 11-261181 | 9/1999 |
| JP | 2000-049429 | 2/2000 |
| JP | 2001-053449 | 2/2001 |
| JP | 2001-144440 | 5/2001 |
| JP | 2002-083920 | 3/2002 |
| JP | 2002-156430 | 5/2002 |
| JP | 2003-279611 | 10/2003 |
| JP | 2004-087589 | 3/2004 |
| JP | 2005-294511 | 10/2005 |
| JP | 2007-085741 | 4/2007 |

OTHER PUBLICATIONS

Japanese Office Action; 3 pages.

\* cited by examiner

*Primary Examiner* — Tuan T Dinh
(74) *Attorney, Agent, or Firm* — Antonelli, Terry, Stout & Kraus, LLP.

(57) ABSTRACT

There is provided a circuit substrate to be mounted in an electronic apparatus, and the circuit substrate has a power supply and a GND. The GND of the circuit substrate is electrically connected to GNDs of other components of the electronic apparatus through connecting parts. The circuit substrate has a part or circuit that implements a low impedance in an intended frequency range between the peripheral conductor of the connecting part opening to be used for the connection and the power supply of the circuit substrate.

5 Claims, 8 Drawing Sheets

CIRCUIT FOR SUPPRESSING ELECTROMAGNETIC INTERFERENCE, IMPLEMENTATION STRUCTURE AND ELECTRONIC APPARATUS IMPLEMENTING THE SAME

BACKGROUND OF THE INVENTION

1. Field of the Invention

The present invention relates to a technology that controls or suppresses the current being the origin of electromagnetic waves flowing from a circuit substrate to a cabinet or electronic apparatus in which the circuit substrate is implemented.

In an electronic apparatus, for example, shielding an electronic apparatus cabinet against electromagnetic waves or suppressing the level of electromagnetic interference caused by a circuit substrate is effective to trap electromagnetic interference caused by the circuit substrate within the electronic apparatus and prevent the leakage to the outside of the electronic apparatus.

The excitation source of electromagnetic interference radiated by a single substrate is an element such as an LSI and a crystal oscillator, and signals or a pattern of the GND may often act as an antenna that radiates electromagnetic energy into the air. Therefore, in order to reduce electromagnetic interference, the layout of a PCB or the circuit may be changed. Furthermore, a measure against EMI (ElectroMagnetic Interference) may be taken in a single substrate.

2. Description of the Related Art

Inventors in the past have disclosed magnetic field probes or measuring methods and apparatus as disclosed in Patent Document 1 (JP-A-2002-156430) and Patent Document 2 (JP-A-2003-279611) as supporting technologies for reducing electromagnetic interference caused by a circuit substrate. The former of the technologies disclosed in Patent Documents 1 and 2 relates to a magnetic field probe, and the latter relates to a measuring method and apparatus. They may be used for the investigation for reducing electromagnetic radiation from a circuit substrate by measuring a magnetic field distribution in the vicinity above the circuit substrate and thus locating the current causing the electromagnetic radiation and are effective as measures against EMI to a single substrate.

However, even though the EMI measure is successfully taken in a single substrate in this way, current to a cabinet, for example, (which will be called cabinet current, hereinafter) may flow from the circuit substrate through a connecting part when the substrate is stored in the cabinet (such as a frame and a chassis) and/or implemented in an electronic apparatus, for example. Therefore, the level of electromagnetic interference may change, and another EMI measure may be required, which is a problem.

Against the problem, a method has been generally applied that optimizes the structure or structures of a slit and/or metallic body that a cabinet has in order to reduce the radiation efficiency as an antenna of the cabinet. Furthermore, as disclosed in Patent Document 3 (JP-A-7-225634), Patent Document 4 (JP-A-10-190166), and Patent Document 5 (JP-A-10-242601), a method has been proposed that provides a filter in a connecting part between a circuit substrate GND and a cabinet GND and controls the strength, phase and frequency of current flowing out to the cabinet.

However, in the method that optimizes the form of a cabinet, the optimization of a cabinet form may delay since how current flows to the cabinet is not realized until a circuit substrate is implemented therein. Furthermore, designing a cabinet quickly and properly is significantly difficult when multiple circuit substrates are implemented in one cabinet or when a circuit substrate is repeatedly revised, for example.

The method that provides a filter in a connecting part between a circuit substrate and a cabinet as disclosed in Patent Document 3 to Patent Document 5 has a problem that it is difficult to obtain an effective characteristic at an estimated time for implementing the circuit substrate in the cabinet since the path and electric characteristic of the current causing the cabinet radiation to be reduced are not known in designing. Furthermore, since a finite impedance is provided between the GND of the circuit substrate and the GND of the cabinet, the GND potential of the circuit substrate becomes unstable against the potential of the cabinet, which may cause a problem in the circuit function. Still further, since the filtered current flows on the circuit substrate, the electromagnetic radiation level from the circuit substrate itself may highly possibly increase.

On the other hand, from the viewpoint of ESD (Electro Static Discharge) measures, the connecting part may be positioned near an input/output part such as a connector and a cable or a short circuit may be established by using a resistance of $0\Omega$ to allow electric disconnection or connection between the connecting part electrically connecting to a cabinet and the GND of the circuit substrate. In both cases, the problems are not solved at all from the viewpoint of EMC.

SUMMARY OF THE INVENTION

The invention was made in order to solve the problems. In other words, the invention provides a circuit substrate that can reduce electromagnetic interference at a cabinet level by avoiding the problems and suppressing the current flowing out from the circuit substrate to the cabinet through a connecting part and an electronic apparatus implementing the circuit substrate.

The summary of the typical invention among the invention described in this specification is simply explained below.

According to an aspect of the invention, there is provided a circuit substrate having an opening for inserting a connecting part, the circuit substrate including a power supply, a GND, and a capacitor that connects a conductor pattern provided at the circumferential edge of the opening and electrically connected to the GND and a conductor pattern electrically connected to the power supply.

In the circuit substrate, the capacitor may be implemented at a distance of $\frac{1}{4}*f*tpd$ or below from the opening on the circuit substrate where the caused noise voltage is f, and the propagation delay time is tpd.

According to another aspect of the invention, there is provided an electronic apparatus including a circuit substrate having a power supply and a GND, a connecting part extending through an opening of the circuit substrate, a cabinet connected to the circuit substrate through the connecting part, and a capacitor connecting a conductor pattern at the circumferential edge of the opening and a conductor pattern electrically connected to the power supply, wherein the GND of the circuit substrate and the GND of the cabinet are electrically connected through the connecting part and the conductor pattern at the circumferential edge of the opening of the circuit substrate.

In the electronic apparatus, the capacitor may be implemented at a distance of $\frac{1}{4}*f*tpd$ or below from the opening on the circuit substrate where the generated noise voltage is f, and the propagation delay time is tpd.

These and other objects, features and advantages of the invention will be apparent from the following more particular description of preferred embodiments of the invention, as illustrated in the accompanying drawings.

DESCRIPTION OF THE PREFERRED EMBODIMENTS

First of all, a mechanism of electromagnetic radiation from a cabinet, for example, will be described.

Figure 2:
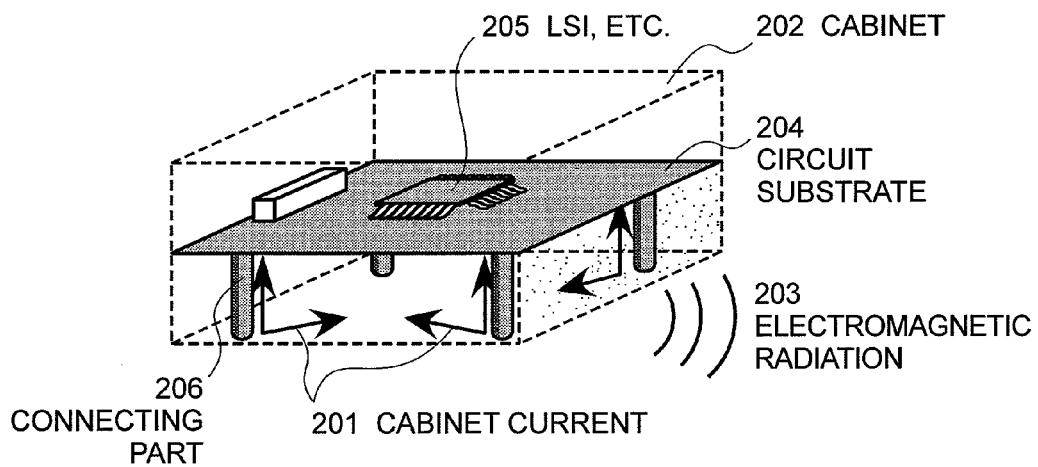
FIG. 2 is a diagram showing a mechanism of electromagnetic radiation from a cabinet according to the invention.

FIG. 2 briefly illustrates cabinet current causing electromagnetic radiation from a cabinet. As shown in FIG. 2, when a circuit substrate 204 having an LSI, IC, etc. 205 is implemented in a cabinet 202, the GND of the circuit substrate 204 and the GND of the cabinet, that is, the cabinet 202 itself are generally electrically connected through a connecting part 206. This is because the reference potential of the circuit substrate becomes unstable when the GND of the circuit substrate and the cabinet are not electrically connected. Thus, all signals based on the unstable GND have noise, which may increase the level of electromagnetic radiation from the circuit substrate.

Conversely, however, the connection between the substrate GND and the cabinet allows the current flow from the LSI, etc. 205, which causes the electromagnetic interference, to the cabinet 202 through the circuit substrate 204 and the connecting part 206. Thus, due to the cabinet current 201, the electromagnetic radiation 203 is caused from the cabinet 202. In some cases, the GND of the circuit substrate may be connected to the GND of another component, instead of the cabinet, through a connector or a harness, for example. Also in this case, the connection with the cabinet is required since the GND impedance of the cable or harness is particularly high in a high frequency area, which disadvantageously causes the problem of the electromagnetic radiation from the cabinet.

Accordingly, the inventor and so on focus on the attempt to reduce the current flowing to the connecting part in order to suppress the cabinet current, while keeping the stability of the GND potential of the circuit substrate at the same time. According to the invention, in order to realize the reduction, a low impedance part such as a capacitor is intentionally provided within a predetermined distance (described below) from the connecting part (that is, an opening for the connecting part in a circuit substrate).

Figure 3:
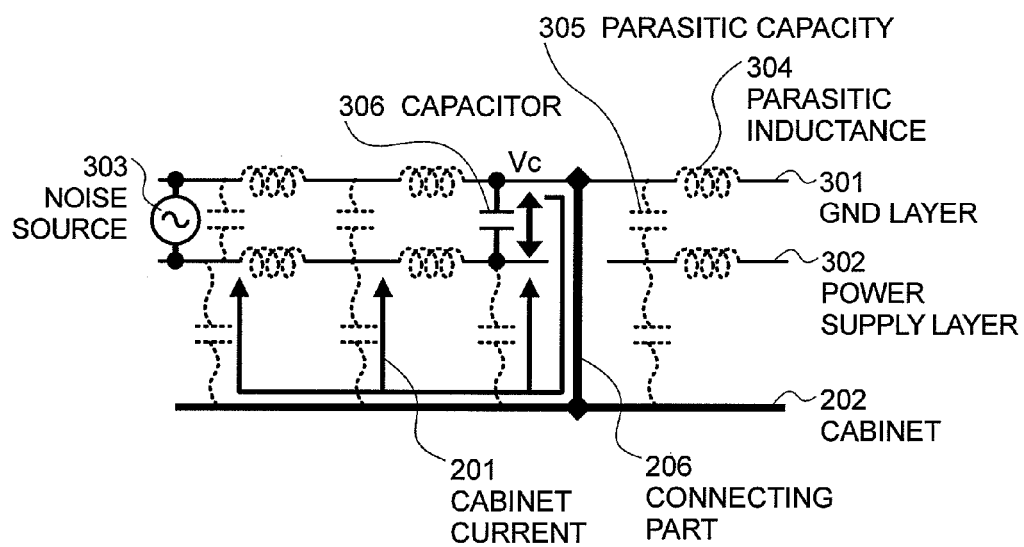
FIG. 3 is a diagram showing a mechanism of suppression of cabinet current according to the invention.

With reference to FIG. 3, a mechanism of the suppression of the cabinet current will be described below. FIG. 3 illustrates a circuit applying a simplified mechanism of the suppression of cabinet current, which is electromagnetic radiation from a cabinet.

Here, a circuit substrate has a GND layer 301 and a power supply layer 302. A noise source 303 is illustrated as a voltage source. In reality, an active element such as a buffer acts as the noise source. However, for simplicity, the noise source is handled as one sinusoidal source since all of the rising and falling components of rectangular waves generated by the switching between active elements can be expressed by the superimposition of the sinusoidal waves, and nothing changes in tendencies of phenomena. Each of the layers has a parasitic inductance 304, and a parasitic capacitance 305 is provided between the layers. As shown in FIG. 3, the cabinet current 201 flowing through the connecting part 206 is caused by a change in potential between the power supply and the GND and returns to the substrate through the parasitic capacitance between the power supply layer and the cabinet.

When a capacitor 306 having a sufficiently larger capacitance value than that of the parasitic capacitance is provided near the connecting part in this case, the potential difference Vc across the capacitor is smaller than that in the case without the capacitor. This is based on the fact that the impedance decreases as the capacitance value of the capacitor increases. The impedance Zc of the capacitor is expressed by $Zc=1/\omega C$.

By decreasing the potential difference across the capacitor, that is, the potential difference between the GND and the power supply, the cabinet current caused by the potential difference can be decreased. Thus, the electromagnetic radiation from the cabinet can be reduced.

Having assumed the structure in which the power supply layer faces against the cabinet here, the same effect is provided by the GND layer facing against the cabinet only with a change in the direction of current flow and the effect is not changed.

Next, the result from the verification by experiment of the effect will be described.

Figure 4:
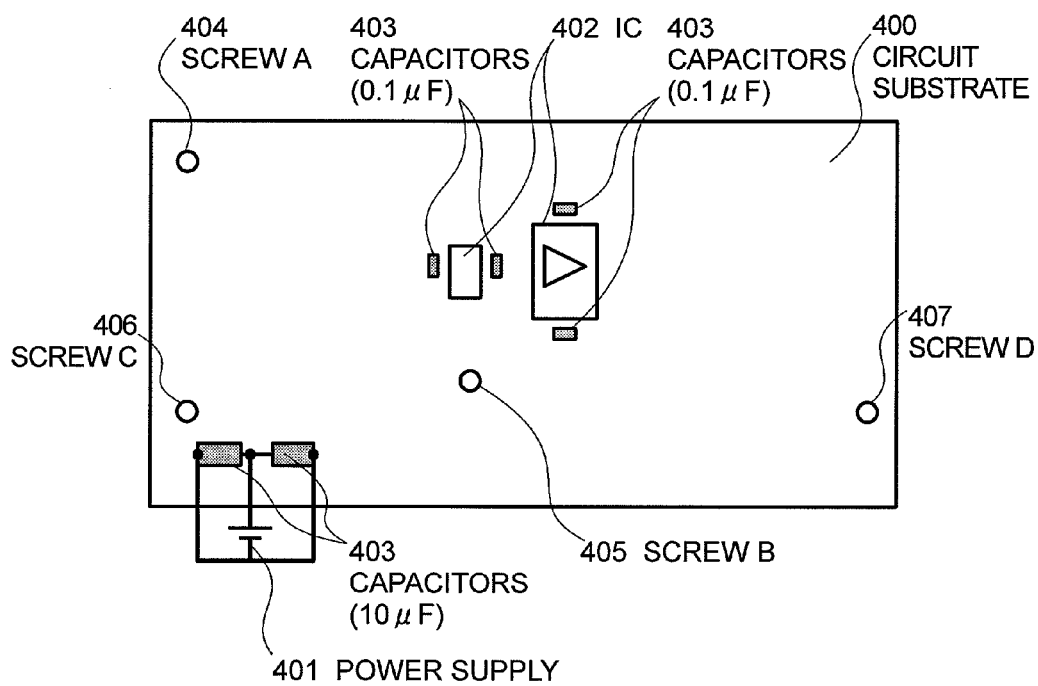
FIG. 4 is a diagram showing the layout of parts on the circuit substrate according to the invention.

FIG. 4 shows a substrate used in a verification experiment. A circuit substrate 400 employs a four-layered substrate of a power supply layer, a GND layer, a front layer and a back layer and has a power supply 401, an IC 402, which is a noise source, and a capacitor 403 between the power supply and the GND at the position as shown ion FIG. 4. The circuit substrate 400 has four screw holes, which are openings for connecting parts, (for a screw A 404, a screw B 405, a screw C 406 and a screw D 407). An HDD (Hard Disk Drive) of 3.5 inches is used as a cabinet (not shown).

FIGS. 5A to 5D show the results of the measurement of the electric field strengths three meters away from the substrate and cabinet with different screw positions A to D for connecting.

Figure 5:
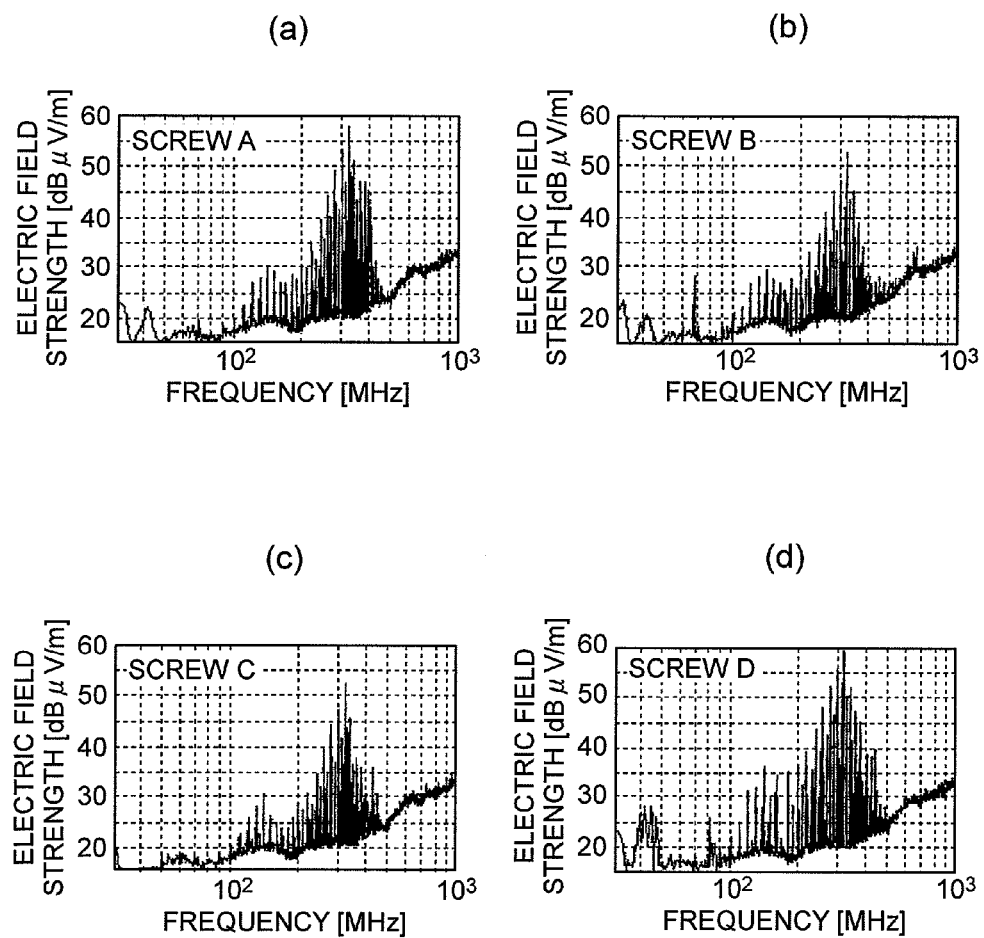
FIGS. 5A to 5D are diagrams showing frequency characteristics of electromagnetic interference from a cabinet according to the invention and diagrams showing characteristics at positions of screws A to D.

The result from fastening the screw B (FIG. 5B) or C (FIG. 5C) is lower by the order of 9 dB at maximum than the result from fastening the screw A (FIG. 5A) or D (FIG. 5D). This agrees with the correlation of the distances from the screw positions to the directly near capacitor. In other words, the result shows the effect that the capacitor placed near the connecting part, such as a screw, to the cabinet, can suppress the cabinet current. This may be because the capacitor between the power supply and the GND suppresses a change in potential between the power supply and the GND.

Next, the distance from the connecting part (that is, the opening for the connecting part in the circuit substrate) to the capacitor for obtaining the effect, that is, the distance dependency of the effect of the suppression of a change in potential between the power supply and the GND by the capacitor will be described.

First of all, the parasitic inductance and parasitic capacitance of general power supply and GND layers are 0.1 nH/mm and 0.4 pF/mm, and the propagation delay time tpd based on them can be obtained by:

$$t_{pd} = \sqrt{L \cdot C} = \sqrt{0.1 \text{ nH} \cdot 0.4 \text{ pF}} = 6.3 p \sec/mm \quad [\text{EQ 1}]$$

where L and C are values obtained from the analysis on an electromagnetic field by Moment method, and, even when the interlayer distance, for example, changes, the balance between L and C does not change significantly and tpd=6 to 7 psec/mm is obtained.

The rising time tr of the voltage between the GND and the power supply, which is changed by noise, in the connecting part, which is ¼ of the wavelength at the frequency f of the noise voltage, can be expressed by:

$$tr = 1/(4*f)$$

By using the propagation delay time tpd in this case, the reaching distance of the electromagnetic field at a frequency, that is, the reaching distance d of the effect of the capacitor can be expressed by:

$$d = \frac{1}{4} * f * tpd \quad [\text{EQ2}]$$

Figure 6:
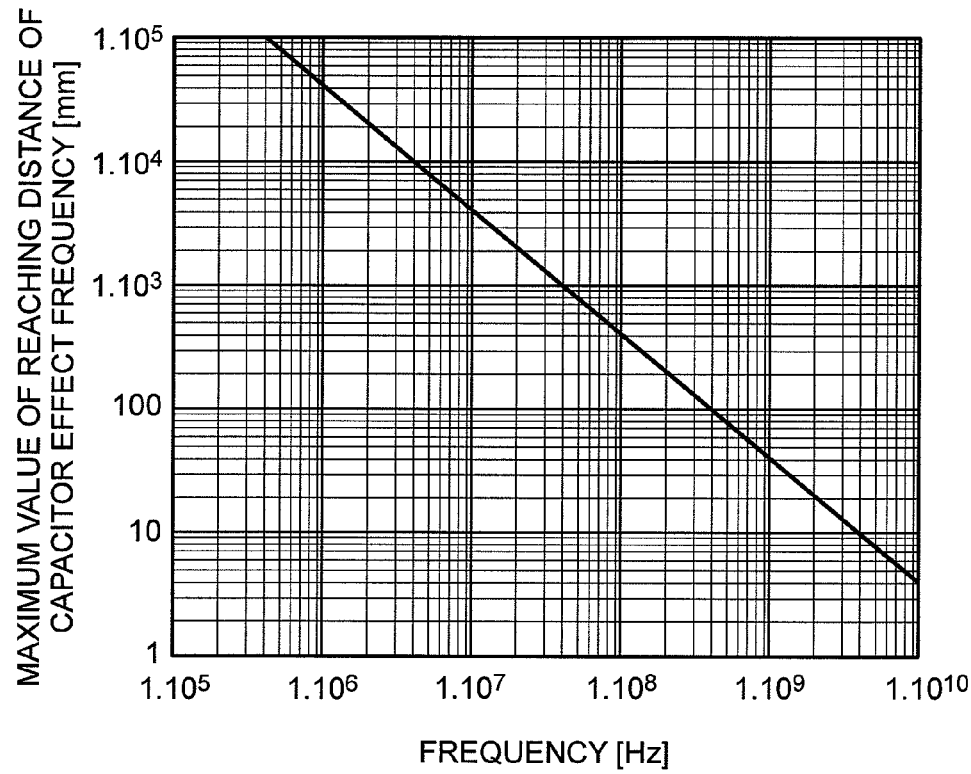
FIG. 6 is a diagram showing the frequency dependency of effect reaching distance of a capacitor according to the invention.
Figure 7:
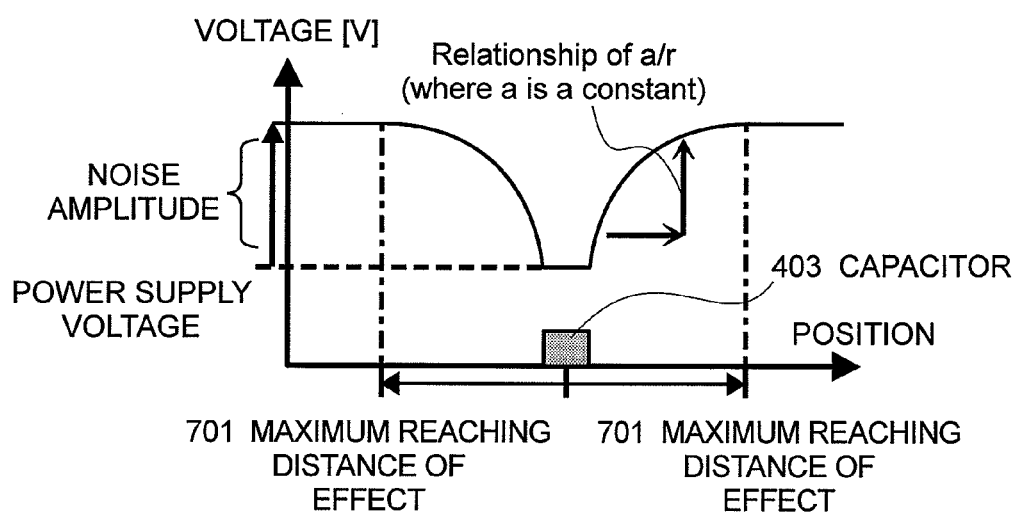
FIG. 7 is a diagram showing the distance dependency of the potential suppression effect of a capacitor according to the invention.

FIG. 6 shows the relationship between frequencies and the maximum values of the reaching distance of the effect of the capacitor. The relationship indicates that the distance is about 40 mm when the frequency is 1 GHz. Here, the value is a maximum value of the reaching distance, and the capacitor may be required to place at much closer position in order to obtain a clearer effect of the suppression of the potential change. FIG. 7 is a diagram schematically showing the effect of the suppression of the potential change of the capacitor and surroundings. The capacitor accumulates more charges than those of the surroundings, and the potential formed by them suppresses the potential change of the surroundings. The potential formed in the surroundings by a certain amount of charges can be expressed as a/r where the distance from the charges is r (where a is an amount of charges, which is a constant depending on the dielectric constant). In order to increase the effect of the suppression of the potential change of the capacitor, the distance from the center part of the capacitor 403 may be required to be ½ or desirably 1/10 of the maximum reaching distance 701 of the effect or below. The effect increases as the distance decreases at or below the maximum value d of the effect reaching distance.

Next, the verification result by a simulation will be described.

Figure 8:
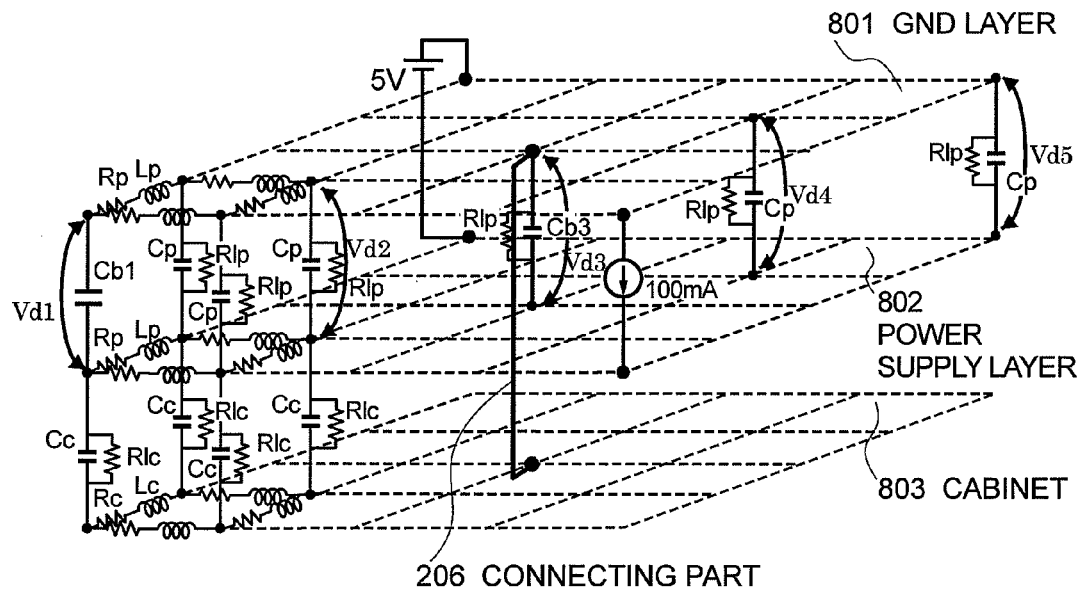
FIG. 8 is a diagram showing an equivalent circuit of a circuit substrate and cabinet according to the invention.

FIG. 8 shows a circuit diagram used for the analysis. A GND layer 801, a power supply layer 802 and a cabinet 803 are simply divided by 4×4 meshes. A parameter for one mesh to be used for the simulation is obtained so as to meet the physical amount of 5 mm×5 mm. When each of the GND layer and power supply layer has a parasitic inductance Lp, the cabinet has a parasitic inductance Lc, the parasitic capacitance present between the GND layer and the power supply layer is Cp, and the parasitic capacitance present between the power supply layer and the cabinet is Cc in this case, and Lp=0.18 nH, Lc=0.9 nH, Cp=6 pF and Cc=0.3 pF. Both of the resistance component Rp that the GND layer and power supply layer have and the resistance component Rc that the cabinet has are 0.1Ω. When the leakage resistances of the Cp and Cc are Rlp and Rlc, Rlp=1.3 kΩ and Rlc=34 kΩ. The Vd1 to Vd5 refer to interlayer voltages that change between the GND layer and the power supply layer at the positions.

Figure 9:
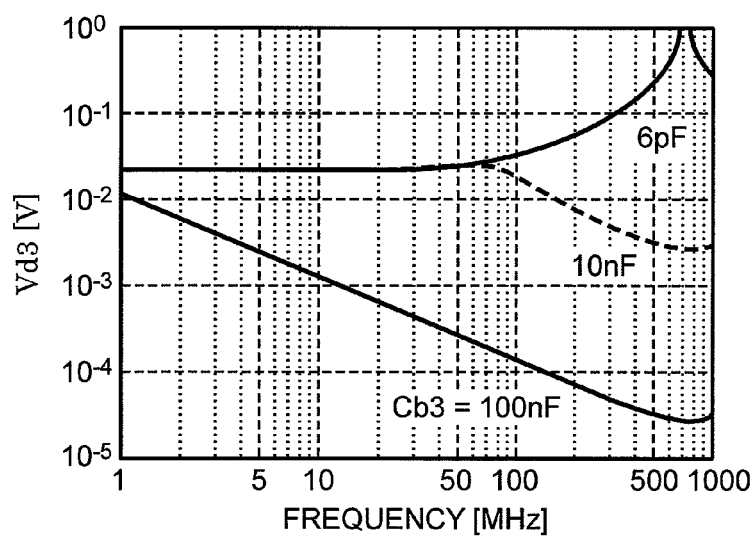
FIG. 9 is a diagram showing the Cb3 dependency of the Vd3 frequency characteristic according to the invention.

FIG. 9 shows changes in Vd3 when the value of the capacitance Cb3 of the center of the layer is changed to 100 nF, 10 nF and 6 pF in a case that the Cb1 has 6 pF, which is equal to the parasitic capacitance, that is, the Cb1 does not have a capacitor. FIG. 9 shows that the potential change decreases as the value of the capacitance increases. This means that the low impedance of the capacitor results in small changes in voltage.

Figure 10:
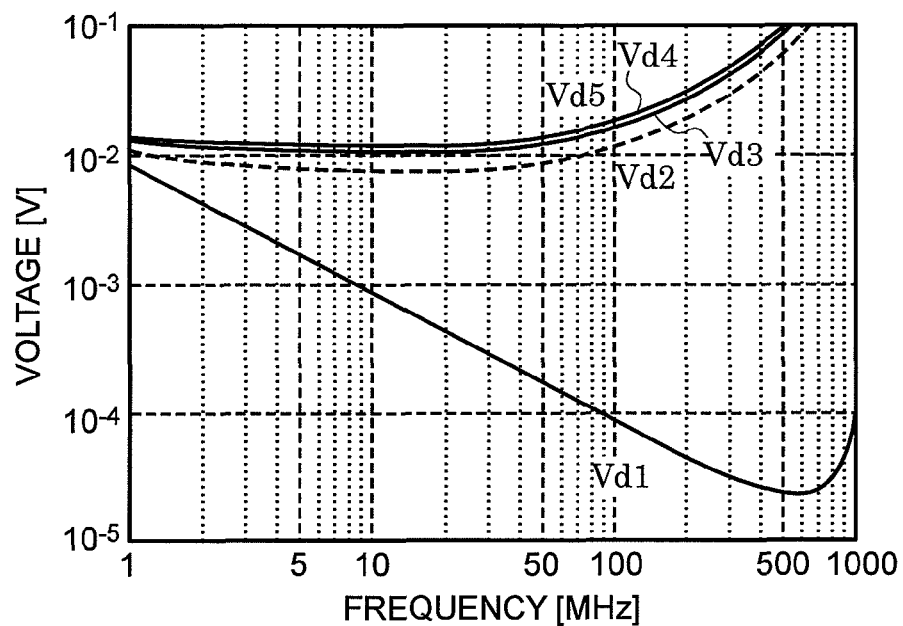
FIG. 10 is a diagram showing the position dependency of the frequency characteristic with changed potentials according to the invention.

FIG. 10 shows potential changes between the power supply and the GND from the Vd1 to Vd5 when the value of the Cb1 is 100 nF in a case that the Cb3 is 6 pF. As the distance from the capacitor Cb1 increases, the potential change increases. As the distance decreases, the effect of the suppression of the potential change by the capacitor increases.

Figure 11:
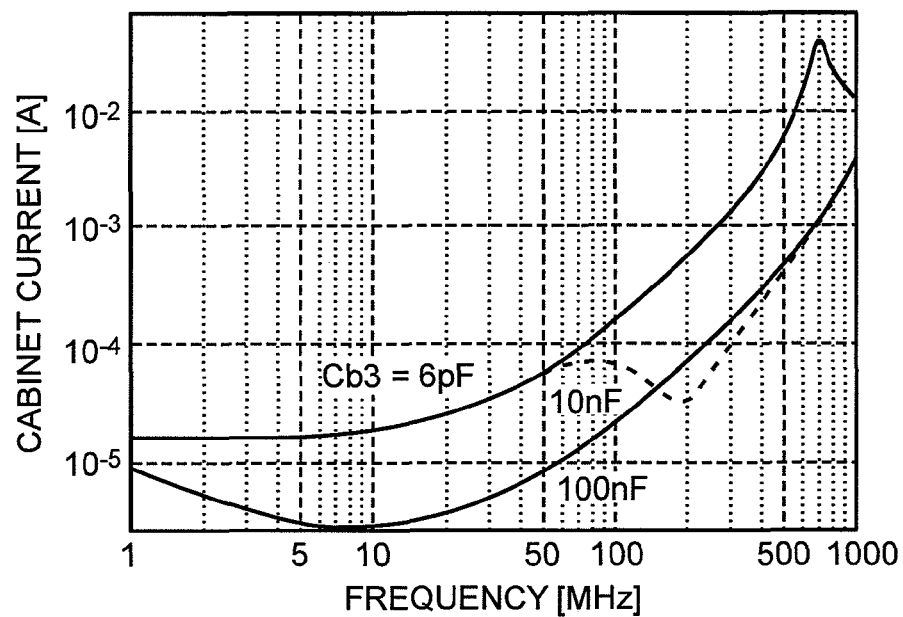
FIG. 11 is a diagram showing the Cb3 dependency of the frequency characteristic of cabinet current according to the invention.

Furthermore, FIG. 11 shows a current value frequency characteristic of the current flowing out from the circuit substrate to the cabinet when the capacitance value Cb3 is changed to 100 nF, 10 nF and 6 pF in a case that the Cb1 has 6 pF. As the capacitance value increases, the value of the current flowing from the circuit substrate to the cabinet decreases.

The result shows that the capacitor between the power supply and the GND suppresses the cabinet current. Particularly, as the capacitance of the capacitor increases and as the distance between the capacitor and the connecting part (that is, the opening for the connecting part in the circuit substrate) decreases as small as possible, the effect increases.

Next, a capacitor implementation structure for suppressing the cabinet current to a circuit substrate will be described.

Figure 1:
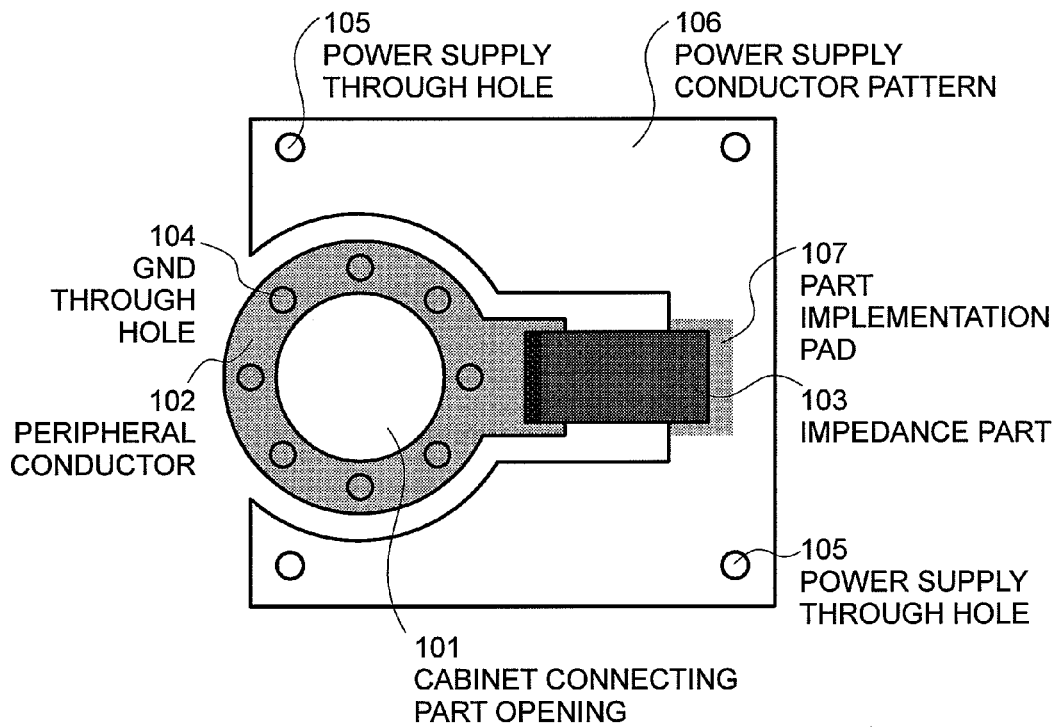
FIG. 1 is a diagram showing the implementation structure of a cabinet current suppressing circuit according to the invention.

FIG. 1 shows a first example of a circuit for suppressing cabinet current flowing from a circuit substrate to a cabinet through a connecting part and a conductor pattern layout for implementing the circuit.

The cabinet current suppressing circuit is provided on a circuit substrate having a power supply and a GND (not shown) and includes a peripheral conductor 102 placed at the circumferential edge of the cabinet connecting part opening 101 for connecting the circuit substrate and a cabinet and electrically connected to the substrate GND through a GND through hole 104, a power supply conductor pattern 106 placed near the peripheral conductor and electrically connected to the power supply of the substrate through a power supply through hole 105, and a low impedance part 103 such as a capacitor that connects the peripheral conductor 102 and the power supply conductor pattern 106. In this example, a part of the peripheral conductor 102 has a convex, and the low impedance part 103 is placed and mounted between the convex of the peripheral conductor 102 and a part implementation pad 107 on the power supply conductor pattern 106.

Here, when the distance between the center part of the cabinet connecting part opening 101 and the low impedance part 103 is shorter than the maximum reaching distance d of the potential change suppression effect, the cabinet current is thus suppressed, which can reduce the electromagnetic radiation from the cabinet.

Figure 12:
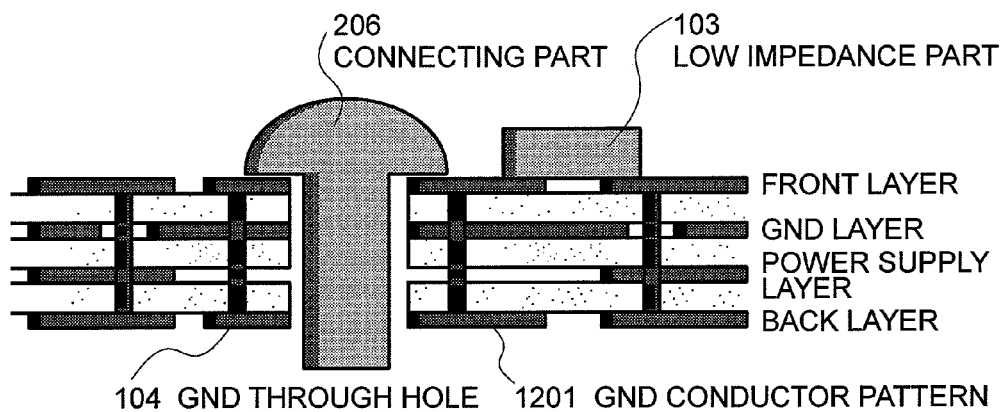
FIG. 12 is a diagram showing a section view of the implementation structure of a cabinet current suppressing circuit according to the invention.

FIG. 12 shows a section view in which the connecting part 206 is crimped to the connecting part opening 101 in this structure. FIG. 12 shows an example of a predetermined GND conductor pattern 1201 in the structure having a front layer, a GND layer, a power supply layer and back layer where the GND layer is connected to the front layer and back layer through a through hole. However, the invention is not limited thereto but the construction of layers, the position of the through hole, and the pattern form are not limited. A build-up method may be used with a hole, which is not a through hole. Using the build-up method provides a high degree of flexibility to the layer construction, the position of holes and so on.

In other words, changes can be made to the other construction if an electronic part or circuit having a low impedance in an intended frequency range is provided in the range of the distance providing the effect between the GND of the circuit substrate electrically connected to the GND of the cabinet through a connecting part and the power supply level of a circuit substrate.

Next, a second example of the capacitor implementation structure for suppressing cabinet current to a circuit substrate will be described.

Figure 13:
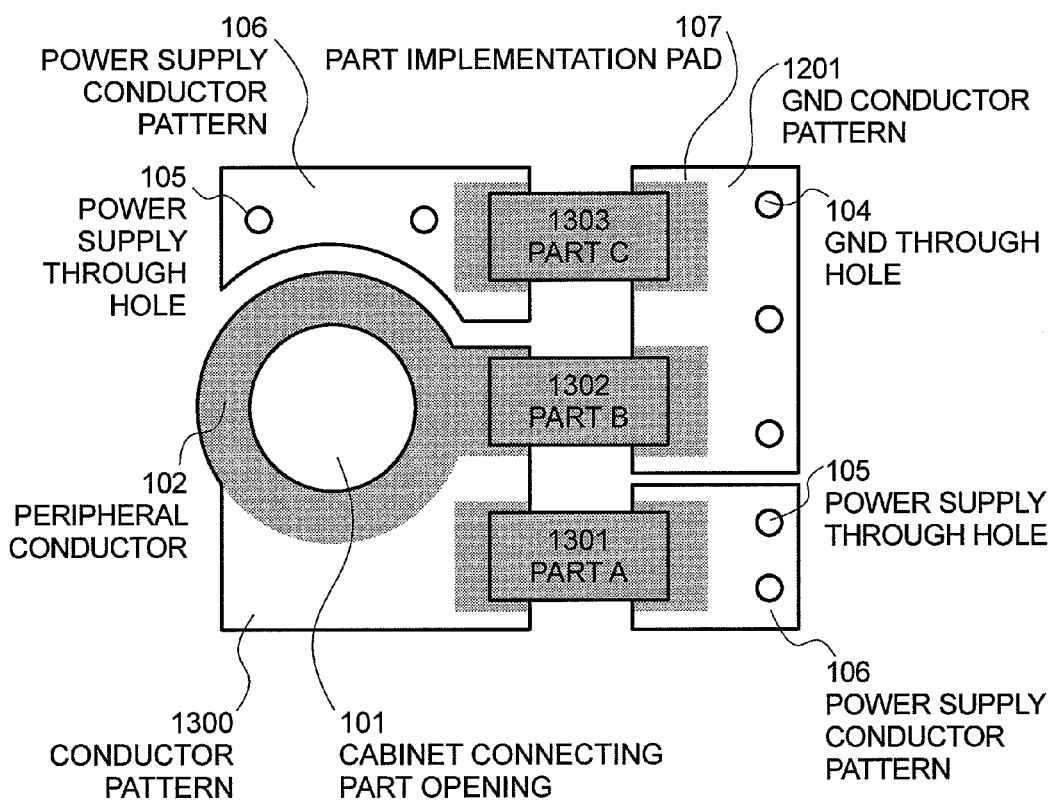
FIG. 13 is a diagram showing the implementation structure of a second cabinet current suppressing circuit according to the invention.

FIG. 13 shows a structure that allows the implementation of a series part such as an inductor in addition to the capacitor between the power supply and the GND.

In other words, the structure has the peripheral conductor 102, which is a part of a conductor pattern 1300 on the surface of a circuit substrate, provided at the circumferential edge of the cabinet connecting part opening 101 for connecting the circuit substrate and a cabinet, the GND conductor pattern 1201 electrically connected to the substrate GND through the GND through hole 104, and at least two power supply conductor patterns 106 electrically connected to the power supply layer through the power supply through hole 105, a part A 1301 that connects the first power supply conductor pattern 106 and the conductor pattern 1300, a part B 1302 that connects the conductor pattern 1300 and the GND conductor pattern 1201, and a part C 1303 that connects the GND conductor pattern 1201 and the second power supply conductor pattern 106.

In this case, the peripheral conductor 102 at the circumferential edge of the connecting part opening 101 is connected to the circuit substrate GND through the part B 1302 without connecting to the GND of the circuit substrate. However, also in this example, when the distances between the center part of the cabinet connecting part opening 101 and the low impedance parts A 1301 and C 1303 are shorter than the maximum reaching distance d of the effect of the suppression of the potential change, the cabinet current can be thus suppressed, which can reduce the electromagnetic radiation from the cabinet.

However, in this example, a finite impedance present between the cabinet and the circuit substrate GND may instablize the GND of the circuit substrate. Therefore, the impedance of the part B 1302 is preferably kept as small as possible at a frequency that the circuit operates. It should be noted that the structure and pattern layout for implementing the circuit connections are not limited to the manner described above.

Figure 14:
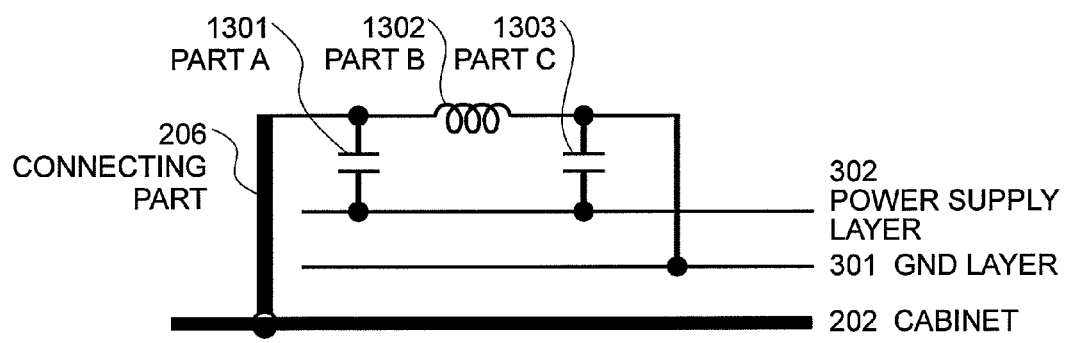
FIG. 14 is a diagram showing the second cabinet current suppressing circuit according to the invention.

FIG. 14 shows the electric connection of the structure in the second example in a circuit. Providing capacitors as the parts A and C and an inductor as the part B between the GND layer 301 and the power supply layer 302 allows more suppression of the cabinet current, which can reduce electromagnetic radiation.

Having specifically described the invention made by the inventor based on the embodiments, the invention is not limited to the embodiments. Various changes can be made thereto without departing from the scope and spirit of the invention.

Having described the example that a low impedance part such as a capacitor is implemented between the power supply and the GND near the connecting part between a cabinet, for example, and a circuit substrate according to the embodiment above, the implementation is not limited between the power supply and the GND. The implementation may be between a digital GND and an analog GND if the GND includes the analog GND and the digital GND, and if the cabinet and the analog GND are connected. The target power supply voltage is not limited on the substrate that uses multiple voltages.

Mainly having described a capacitor as a part that realizes a low impedance at a desired frequency, the invention is not limited thereto. A low impedance may be achieved at a noise frequency, which is the problem, by controlling the impedance by a combination of transistors. A construction may be adopted in which a parallel-plate capacitor is provided by a conductor pattern on a substrate, and the implementation of parts may be omitted. Alternatively, multiple low impedance parts or circuits may be provided to one connecting part.

Having described the example that the cabinet current decreases as the value of the capacitor increases in the analysis result by the simulation, an optimum capacitor capacitance value may exist with some impedances of cabinets. Therefore, the capacitance value may be defined properly. The same is true to cases with electric resonance.

Having described the example in which the position of one connecting part is changed, a low impedance part such as a capacitor near the connecting part has the cabinet current suppression effect also when multiple connecting parts are provided on the circuit substrate. Though, when multiple connecting parts are provided, the current flowing from the substrate to the cabinet through one connecting part may flow from the cabinet to the substrate through another connecting part, form loop current and increase the electromagnetic radiation, the invention suppresses the current flowing out from the substrate to the cabinet, which originally causes the problem. In this case, low impedance parts such as a capacitor are desirably placed near all of the multiple connecting parts. Furthermore, the implemented multiple low impedance parts such as capacitors are not required to have an equal impedance at the problematic frequencies. The values are desirably optimized so as to balance with variations among impedances in relation to the connecting parts of the cabinet.

Having described above the example in which a low impedance part such as a capacitor is additionally placed near a connecting part, the position of the connecting part may be changed to the vicinity of a low impedance part such as a capacitor present on the circuit substrate. More specifically, since a capacitor between a power supply and a GND is used particularly near the power supply or near an active element such as an LSI on a circuit substrate for many electronic apparatus, the capacitor may be often installed when basic circuit functions thereof are designed. Therefore, the connecting part opening may be placed within the effective distance from a bypass capacitor implemented upon basic design, which is effective in this case since the necessity for adding another low impedance part such as a capacitor against EMC can be eliminated.

As described above, according to the present invention, the circuit and implementation on a circuit substrate can suppress the current flowing from the circuit substrate to a cabinet or an electronic apparatus, and the electromagnetic interference can be reduced.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A circuit substrate comprising:
   a power supply layer;
   a GND layer;
   an opening for inserting a connecting part for connecting the circuit substrate and a cabinet;
   a GND conductor pattern provided in a circular shape on a circumferential edge of the opening to connect to a cabinet GND through said connecting part when said connecting part is inserted into the opening, and electrically connected to the substrate GND through a through hole and said the GND layer;
   a power supply conductor pattern placed near said GND conductor pattern and electrically connected to a power supply of the circuit substrate through a through hole and said the power supply layer;
   an impedance part comprising at least one capacitor directly connected to said a GND conductor pattern, and connected to said GND conductor pattern and said a power supply conductor pattern:
   wherein said impedance part is implemented with connecting to said GND conductor pattern which is placed at the circumferential edge of the opening and said power supply conductor pattern at a distance of ¼ *f*tpd or less from a center of said the opening for inserting a connecting part for connecting the circuit substrate and the cabinet on the circuit substrate where the caused noise voltage is f, and the propagation delay time is tpd,
   wherein said GND conductor pattern, said power supply conductor pattern and said impedance part are placed on one side of said circuit substrate;
   wherein said a GND layer is formed in said a circuit substrate or on an opposite side to said one side of said circuit substrate,
   wherein said power supply layer is formed in said circuit substrate or on the opposite side of said circuit substrate, and
   wherein only said GND conductor pattern is implemented between said opening and said circuit substrate.

2. The circuit substrate according to claim 1, wherein:
   the circuit substrate has multiple openings; and
   multiple capacitors are provided, where at least one capacitor is provided to each of the openings.

3. The circuit substrate according to claim 1, wherein multiple capacitors are provided to one opening.

4. The circuit substrate according to claim 1, wherein the capacitor is a parallel-plate capacitor having a conductor pattern.

5. The circuit substrate according to claim 2, wherein the multiple capacitors have different electric values.

* * * * *